US012796438B2

(12) United States Patent
Xie et al.

(10) Patent No.: US 12,796,438 B2
(45) Date of Patent: Nov. 10, 2026

(54) PITCH CHANGE BETWEEN METAL LINES

(71) Applicant: International Business Machines Corporation, Armonk, NY (US)

(72) Inventors: Ruilong Xie, Niskayuna, NY (US); Nicholas Anthony Lanzillo, Wynantskill, NY (US); Brent A. Anderson, Jericho, VT (US); Albert M. Chu, Nashua, NH (US); Lawrence A. Clevenger, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 564 days.

(21) Appl. No.: 18/345,540

(22) Filed: Jun. 30, 2023

(65) Prior Publication Data

US 2025/0006638 A1 Jan. 2, 2025

(51) Int. Cl.
*H10W 20/41* (2026.01)
*H10W 20/00* (2026.01)

(52) U.S. Cl.
CPC ......... *H10W 20/427* (2026.01); *H10W 20/01* (2026.01)

(58) Field of Classification Search
CPC ............................ H10W 20/427; H10W 20/01
USPC .......................................................... 257/773
See application file for complete search history.

(56) References Cited

U.S. PATENT DOCUMENTS 11,289,606 B2 3/2022 Ju et al.
11,296,070 B2 4/2022 Peng et al.
11,552,084 B2 1/2023 Wang et al.
11,610,838 B2 3/2023 Sasaki et al.
2001/0030367 A1* 10/2001 Noguchi ........... H10P 14/69433 257/E21.582
2012/0292777 A1 11/2012 Lotz et al.
2019/0318989 A1* 10/2019 Shao ..................... H10W 20/43
2021/0327800 A1* 10/2021 Feng ...................... H10W 70/05
2021/0391325 A1* 12/2021 Su ....................... H10D 30/6735
2022/0044717 A1* 2/2022 Huang .................. G11C 11/161
2022/0093594 A1* 3/2022 Song .............. H03K 19/018521
2023/0069119 A1 3/2023 Peng et al.
2023/0335559 A1* 10/2023 Baek .................... H10D 84/907
2024/0055433 A1* 2/2024 Liaw ..................... G06F 30/392

FOREIGN PATENT DOCUMENTS

DE 102020129673 A1 9/2021

OTHER PUBLICATIONS

Sisto, G., Chehab, B., Genneret, B., Baert, R., Chen, R., Weckx, P., . . . & Milojevic, D. (Jul. 6, 2021). IR-Drop Analysis of Hybrid Bonded 3D-ICs with Backside Power Delivery and μ-& n-TSVs. In 2021 IEEE International Interconnect Technology Conference (IITC) (pp. 1-3). IEEE.

* cited by examiner

*Primary Examiner* — Eric W Jones

(74) *Attorney, Agent, or Firm* — Harrity & Harrity, LLP

(57) ABSTRACT

A semiconductor structure including a device layer, a back end-of-line layer, and a backside power distribution layer. The backside power distribution layer includes a first line network with having a first pitch, and a second line network having a second pitch. The second pitch is greater than the first pitch. In one example, the second pitch is at least 7 times (7×) greater than the first pitch.

20 Claims, 14 Drawing Sheets

PITCH CHANGE BETWEEN METAL LINES

BACKGROUND

The present invention generally relates to electrical devices, and more particularly to layouts for metal lines for powering microelectronic devices.

A power delivery network is designed to provide power supply and reference voltage (i.e., VDD and VSS) to the active devices on the die. The power delivery network can be metal wires fabricated through back-end-of-line (BEOL) processing on the frontside of the wafer. The power delivery network shares this space with the signal network, i.e., the interconnects that are designed to transport the signal. To deliver power from the package to the transistors, electrons traverse through the multiple layers of the BEOL stack through metal wires and vias that get increasingly narrow (hence, more resistive) when approaching the transistors. On their way, they lose energy, resulting in a power delivery drop when bringing the power down. When arriving closer to the transistor, i.e., at the standard cell level, the electrons end up in VDD and VSS power and ground rails. These rails take up space at the boundary and between each standard cell. From here, they connect to the source and drain of each transistor through a middle-of-line interconnect network. But with each new technology generation, the aforementioned architecture struggles to keep pace with the transistor scaling. The 'power interconnects' increasingly compete for space in the back end of the line (BEOL) network. Also, the power and ground rails take up a considerably large area at the standard cell level, limiting further standard cell height scaling.

SUMMARY

In one aspect, a semiconductor structure is provided including two backside power arrangements each having a different pitch, e.g., a first line network with a first pitch, and a second line network with a second pitch. In one embodiment, a semiconductor structure is provided that includes a device layer; a back end-of-line layer; and a backside power distribution layer. The backside power distribution layer includes a first line network with having a first pitch, and a second line network having a second pitch, wherein the second pitch is greater than the first pitch. In one embodiment, the second pitch may be 7 times (7×) greater than the first pitch.

In another embodiment, a semiconductor structure is provided that includes a device layer including first conductivity type devices, and second conductivity type devices. The first and second conductivity type devices have backside contacts. The semiconductor structure further includes a first line network of a backside power distribution level having a first pitch between adjacent first metal lines. The first line network includes a first portion of via contacts to the first conductivity type devices and a second portion of via contacts to the second conductivity type devices. The semiconductor structure also includes a second line network of the backside power distribution level having a second pitch between adjacent second metal lines. The second pitch of the second line network is greater than the first pitch of the first line network. In one embodiment, a first portion of the second metal lines connect the first portion of via contacts to the first conductivity type devices to a positive power supply (VDD). In one embodiment, a second portion of the second metal lines connect the second portion of via contacts to the second conductivity type devices to a negative power supply (VSS).

In another aspect, a method of forming a semiconductor structure is described that includes forming devices on a substrate. Front side contacts are formed to the device side of the substrate. Backside contacts are formed to the devices on the substrate. A backside power distribution level is formed having a first level with a first line network with adjacent metal lines to the backside contacts having a first pitch, and a second level with a second line network having a second pitch with adjacent metal lines from the positive power supply and the negative power supply to the first line network, wherein the second pitch is greater than the first pitch.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
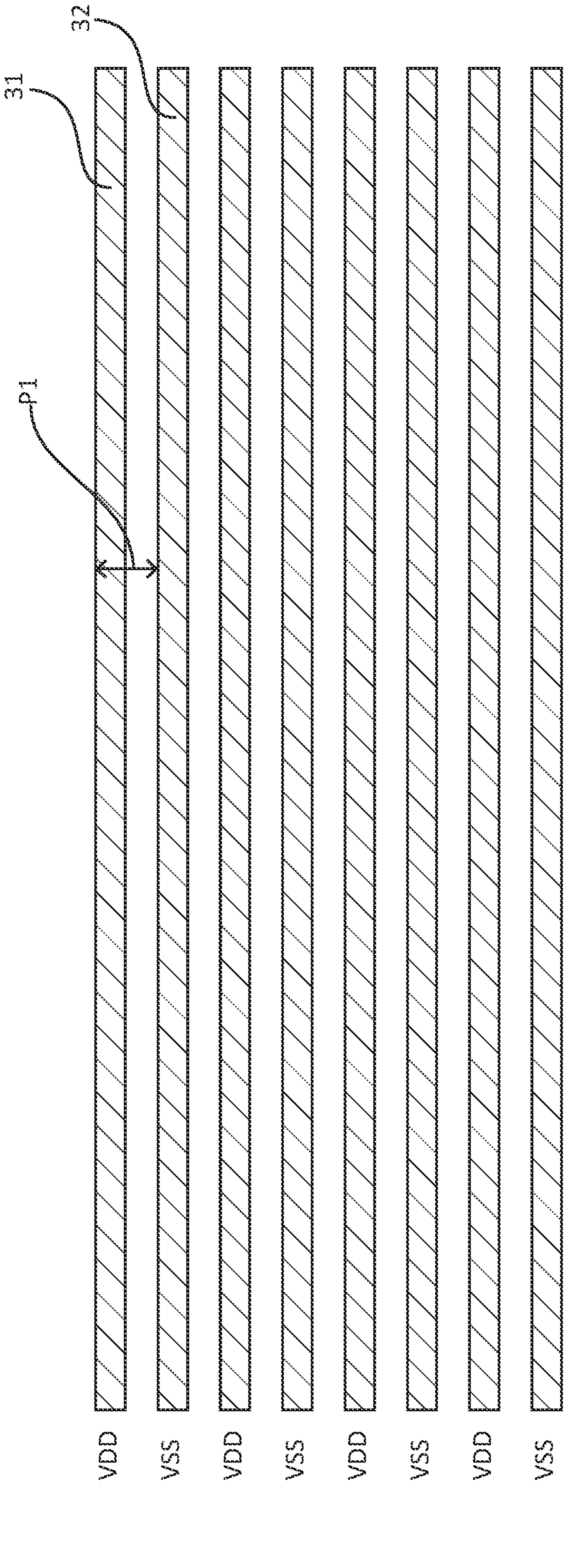
FIG. 1 is a top down view illustrating a level of the backside power distribution including a backside first line network, in accordance with one embodiment of the present disclosure.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It has been determined, that power delivery networks of metal wires fabricated through back-end-of-line (BEOL) processing on the frontside of the wafer struggles to support transistor scaling that is increasingly aggressive in view of advanced technology nodes. For example, the 'power interconnects' increasingly compete for space in the back end of the line (BEOL) network. Further, the power and ground rails take up a considerably large area at the standard cell level, limiting further standard cell height scaling. At the system level, the power density and IR drop increase dramatically, challenging designers to maintain margins that are allowed for the power loss between the voltage regulator and the transistors. Backside power delivery networks can address the aforementioned issues. The idea is to decouple the power delivery network from the signal network by moving the entire power distribution network to the backside of the semiconductor, e.g., silicon wafer, which serves only as a carrier. From there, it enables direct power delivery to the standard cells through wider, less resistive metal lines, without the electrons needing to travel through the back end of the line (BEOL) stack. This approach can provide a benefit in the IR drop, improve the power delivery performance, reduce routing congestion in the BEOL, and when properly designed, allow for further standard cell height scaling.

The structures and methods described herein can provide for a pitch change (e.g., an abrupt pitch change), which can be between the two different metal lines, e.g., a first line network (e.g., first metal line M1) and a second line network (e.g., second metal line M2), that are on two different levels. This provides for a different pitch for the back side contacts for how the separate types of devices, e.g., n-type and p-type devices of a complementary metal oxide semiconductor (CMOS) arrangement, are connected to the different power supplies, e.g., VSS and VDD. VSS (Vss) can be negative supply terminal for an IC or a circuit using semiconductor devices. VDD (Vdd) is the positive supply voltage. The term "pitch" refers to the minimum distance between interconnect lines in each of the first line network (e.g., first metal line (M1)) and the second line network (e.g., the second metal line (M2)). When referring to the minimum center to center distance, it is referring to the dimension that is supported by the manufacturing process that can reproduced the structure. As will be described further below, for the first metal backside pitch (P1), it can be advantageous that the pitch be tight, i.e., small in dimension. The tight pitch separating adjacent metal lines in the first line network (also referred to first metal lines (M1)) can accommodate a tight pitch due to small standard CMOS cell height. The second metal backside pitch (P2) for the second line network pitch (also referred to as the second metal lines (M2)), is greater than the first metal backside pitch (P1). In some embodiments, it is desirable to have a large pitch for the second line network to finish the backside power delivery with the minimum amount of metal levels. Methods for forming the structures depicted in FIGS. 1-4 are now described in more detail with reference to FIGS. 1-16. FIGS. 17-21 illustrate views of the signal line being integrated into the backs power distribution level.

Figure 2:
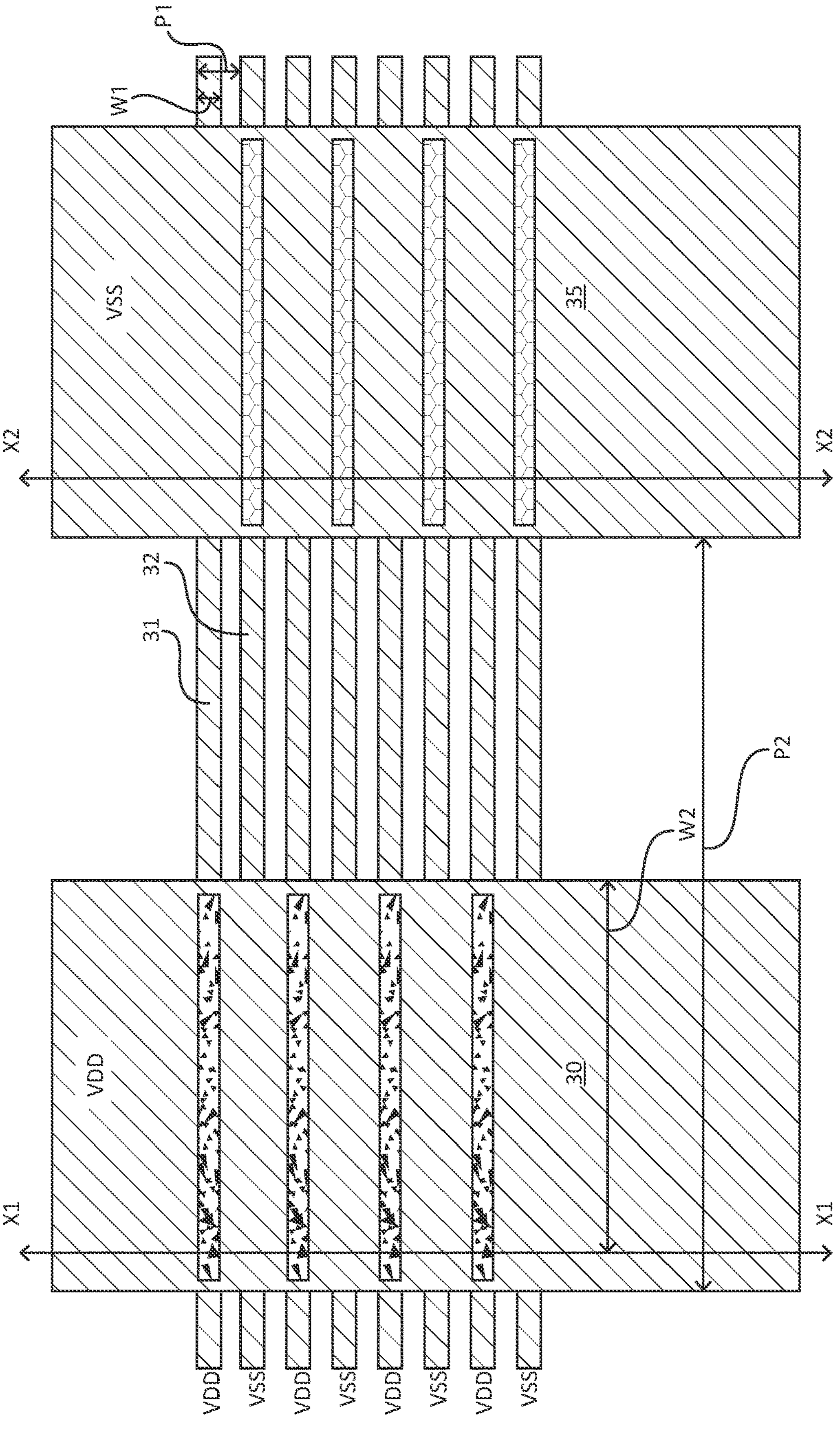
FIG. 2 is a top down view of a level of the backside power distribution including a backside second line network, in which the level that contains the first line network is separate from, i.e., in a different layer than, the level that contains the second line network, in accordance with one embodiment of the present disclosure.

FIG. 1 is a top down view illustrating a level of the backside power distribution including a backside first metal line (M1). FIG. 2 is a top down view of a level of the backside power distribution including a backside second metal line (M2), in which the level that contains the first metal line (M1) is separate from, i.e., in a different layer than, the level that contains the second metal line (M2).

FIG. 1 illustrates a first line network, interchangeably referred to as first metal line (M1). This first metal line (M1) (or first line network) is in direct contact with the devices formed using front end of the line (FEOL) processing, e.g., active and/or passive electronic devices. For example, the first metal line (M1) may be in direct contact with devices such as transistors, e.g., field effect transistors (FETs), fin field effect transistors (FinFETs), vertical field effect transistors (VFETs), nanoscale devices and combinations thereof. The devices may also be passive devices, such as capacitors and resistors. In the example illustrated in FIG. 1, the first metal line (M1) (or first line network), includes a backside contact to the source and drain regions of semiconductor devices, e.g., field effect transistors (FETs). Depending on the conductivity type, e.g., n-type or p-type conductivity, for the source and drains, the backside contact 6 may of this first network, first metal line (M1), brings electrical communication to the different power supplies, e.g., VSS and VDD. VSS (Vss) can be negative supply terminal for an IC or a circuit using semiconductor devices. VDD (Vdd) is the positive supply voltage.

The pitch P1 (referred to as first pitch P1) depicted in FIG. 1 is the dimension separating the adjacent metal lines of the first network, first metal line (M1), that are alternating to VSS and VDD. These first metal lines (M1) (or first line network) are in direct contact, via a backside contact arrangement, with the devices formed using front end of the line processing, e.g., active and/or passive electronic devices. The pitch P1 that is depicted in FIG. 1 is configured to be small, i.e., tight, to accommodate the tight cell height of aggressive scaling of advanced technology nodes.

FIG. 2 illustrates a second line network, interchangeably referred to as second metal line (M2). The second line network (second metal lines M2) include metal lines to the VSS and VDD. The metal lines of the second line network (second metal lines M2) provide electrical communication from the respective VSS and VDD power sources to the metal lines in the first line network (first metal lines M1) that are intended to carry the VSS and VDD power directly to the devices. For example, the first metal line (M1) may be in direct contact with devices, such as transistors, e.g., field effect transistors (FETs), or fin field effect transistors (FinFETs).

The backside second line network, e.g., of second metal lines (M2, have adjacent lines that are separated by a large second pitch P2. This provides that the processing for the backside power delivery network can be finished with minimum metal levels.

As illustrated in FIG. 2, the second pitch P2 separating the adjacent metal lines, e.g., second metal lines M2, in the second line network is greater than the first pitch P1 separating the adjacent metal lines M1 in the first line network. In some embodiments, The backside power distribution includes a first line network, e.g., first metal line (M1), with having a first pitch P1, and a second line network, e.g., second metal line (M2) having a second pitch, wherein the second pitch is greater than the first pitch. In one embodiment, the second pitch may be 7 times (7×) or more greater than the first pitch. For example, if the first pitch P1 is 180 nm or less, the second pitch P2 may be more than 1200 nm. In some embodiments, it is desirable to form backside metal lines, e.g., the second metal lines (M2) for the second line network, with a large pitch P2, so that the backside power delivery network can be finished with a minimum number of metal levels.

FIGS. 1-4 illustrate a semiconductor structure 100 is provided including two backside power arrangements, e.g., first line network, i.e., first metal lines (M1), and second line network, i.e., second metal lines (M2), in which the metal lines in the different line networks are on difference levels of the final device structure, and spacing of the metal lines in the different line networks have a different pitch P1, P2.

Figure 3:
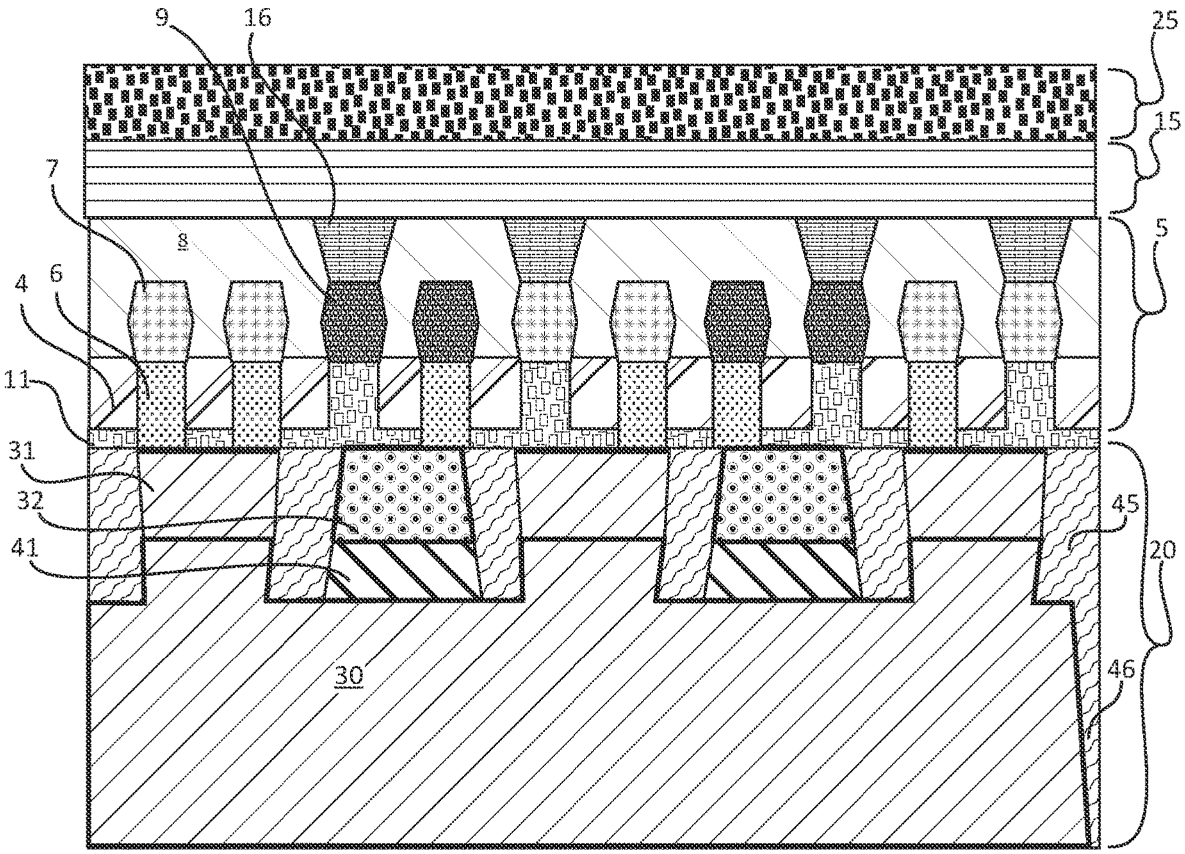
FIG. 3 is a side cross-sectional view along section line X1-X1 in FIG. 2.
Figure 4:
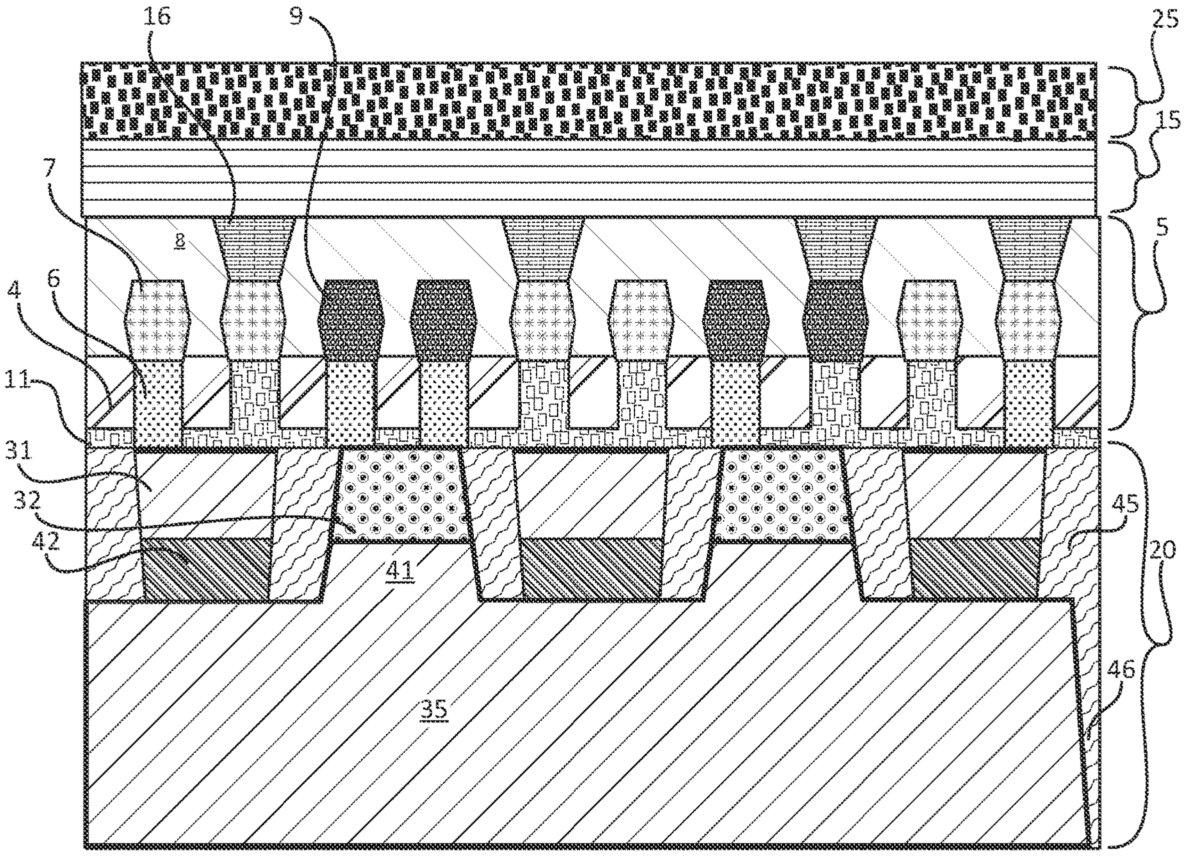
FIG. 4 is a side cross-sectional view along section line X2-X2 in FIG. 2.

Referring to FIGS. 3 and 4, in one embodiment, the semiconductor structure includes a device layer 5; a back end-of-line layer 15; and a backside power distribution layer 20. The back end of the line (BEOL) layer 15 is depicted in FIGS. 3 and 4 as being present atop the device layer 5. The device layer 5 includes the devices that are formed using front end of the line (FEOL) processing. The front end of the line (FEOL) comprises all the process steps that are related to the devices themselves, e.g., active and passive devices, including the gate of a transistor. The BEOL comprises all subsequent process steps. In the back end of the line (BEOL), the various devices formed during the FEOL processing, e.g., active and passive devices, are being interconnected through metal lines.

In the example depicted in FIGS. 3 and 4, the device layer 5 includes active semiconductor features, which could be source and drain regions for transistors, of p-type epitaxial semiconductor material 7, e.g., boron doped SiGe (SiGe:B), or n-type epitaxial semiconductor material 9, e.g., phosphorous doped silicon (Si:P). The device layer 5 also includes a device layer intralevel dielectric layer 8. Underlying the p-type epitaxial semiconductor material 7, and n-type epitaxial semiconductor material 9 within the device layer intralevel dielectric layer 8 is a level of backside contacts 6 having shallow trench isolation (STI) regions 4 present therebetween. As will be discussed below the backside contacts are formed using process sequence that precedes the process sequence that forms the backside power distribution layer 20. The backside contacts 6 may be composed of a metal, such as a silicide metal liner such as Ti, Ni, NiPt, an adhesion metal liner such as TiN, and low resistance metal fills, such as W, Co, Ru, etc.

The device layer 5 may also include a middle of the line (MOL) contact 16. The middle of the line (MOL) contact 16 may be formed to the upper surfaces of the active and/or passive devices in the device layer 5. Similar to the backside contacts 6, the MOL contact 16 may be composed of a metal, such as a silicide metal liner such as Ti, Ni, NiPt, an adhesion metal liner such as TiN, and low resistance metal fills, such as W, Co, Ru, etc.

The back end of the line (BEOL) layer 15 can be composed of a plurality of intralevel dielectric layers and metal lines when necessary for bringing electrical communication to the device in a final configuration from essentially top down when considering that the backside power distribution layer 20 is at the backside of the device.

Sill referring to FIGS. 3 and 4, the back end of the line (BEOL) layer 15 is typically positioned between the device layer 5 and a carrier wafer 25. The carrier wafer 25 supports the structure during the multiple process steps during which the backside of the device may be processed.

Turning to the backside power distribution layer 20, the backside power distribution layer 20 includes a first line network 31, 32, in which a first portion (VDD) 31 of the metal lines from the first line network 31, 32 are backside metal line that connects to backside contacts that direct contact with a first conductivity semiconductor material 7 of an active or passive electrical device in the device layer 5. A second portion (VSS) 32 of the first line network 31, 32 is a backside metal line that connects to backside contacts that are in direct contact with the second conductivity semiconductor material 9 of an active or passive electrical device of the device layer 5.

The backside power distribution layer 20 also includes a second line network 30, 35. A first portion (VDD) 30 of metal lines from the second line network 30, 35 is in VDD power supply, and brings power from the VDD power supply to some of the structures in the device layer 5 through a first portion (VDD) 31 of the first line network 31, 32. VDD (Vdd) can be positive supply terminal for an integrated circuit (IC), or a circuit using semiconductor devices.

A second portion (VSS) 35 of metal lines from the second line network 30, 35 is in the VSS power supply, and brings power from the VSS power supply to some of the structures in the device layer 5 through a second portion (VSS) 32 of the first line network 31, 32. VSS (Vss) can be negative supply terminal for an IC or a circuit using semiconductor devices.

FIG. 3 is a side cross-section along section line X1-X1 in FIG. 2, which illustrates how the backside power distribution layer 10 includes a second line network 30, 35, e.g., second metal lines M2, that is in electrical communication with the VDD power supply, and brings power from the VDD power supply to some of the structures in the device layer 5. VDD (Vdd) can be positive supply terminal for an integrated circuit (IC), or a circuit using semiconductor devices.

For example, in FIG. 3, the first portion (VDD) 30 of the second line network 30, 35 is in contact with some of the metal lines, e.g., a first portion of metal lines (VDD) 31, of the first line network 31, 32. For example, the first portion (Vdd) 30 of metal lines for the second line network 30, 35 includes portions that are in direct contact with the first portion (VDD) 31 of the first line network 31, 32 that are in direct contact as backside contacts to first conductivity semiconductor elements, e.g., p-type semiconductor portions 7. For example, the first portion (VDD) 30 of the second line network 30, 35 may be isolated from the second portion (VSS) 32 of the first line network 31, 32 that are in direct contact as backside contacts 6 to second conductivity semiconductor elements 9, e.g., n-type semiconductor portions. Isolation may be provided by a dielectric spacer 41 present between the second line network 30, 35 and the elements of the first line network 31, 32 that are in direct contact with the second conductivity semiconductor elements 7, e.g., n-type semiconductor portions.

FIG. 4 is a side cross-sectional view along section line X1-X1 in FIG. 2, which illustrates how the backside power distribution layer 10 includes a second line network including a set of metal lines, e.g., some of the metal lines from metal line level M2, that are in electrical communication with the VSS power supply, and brings power from the VSS power supply to some of the structures in the device layer 5.

For example, in FIG. 4, the second portion (VSS) 35 of the second line network 30, 35 is in contact with some of the metal lines of the first line network 31, 32. For example, the second portion (VSS) 35 of the second line network 30, 35 includes portions that are in direct contact with second portion (VSS) 32 of the first line network 31, 32 that are in direct contact as backside contacts 6 to second conductivity semiconductor elements 9, e.g., n-type semiconductor portions, in the device layer 5. Further, the second portions (VSS) 35 of the second line network 30,35 may be isolated from the first portion (VDD) 30 of the first line network 31, 32 that are in direct contact as backside contacts 6 to first conductivity semiconductor elements 7, e.g., p-type semiconductor portions. Isolation may be provided by a dielectric spacer 42 present between the second portion (VSS) of the second line network 30,35 and the first portion (VDD) 30 of the first line network 31, 32 that are in direct contact with the first conductivity semiconductor elements, e.g., p-type semiconductor portions.

It is noted that the structure depicted in FIGS. 1-4 illustrates only one embodiment of the present disclosure, and that variations to the structures depicted in the supplied figures and the above description are within the scope of the present disclosure.

FIGS. 5-16 illustrate one embodiment for a method for producing the electrical device structure depicted in FIGS. 1-4 including a backside power distribution layer 10 that includes at least two levels of metallization having lines with different pitches.

Figure 5:
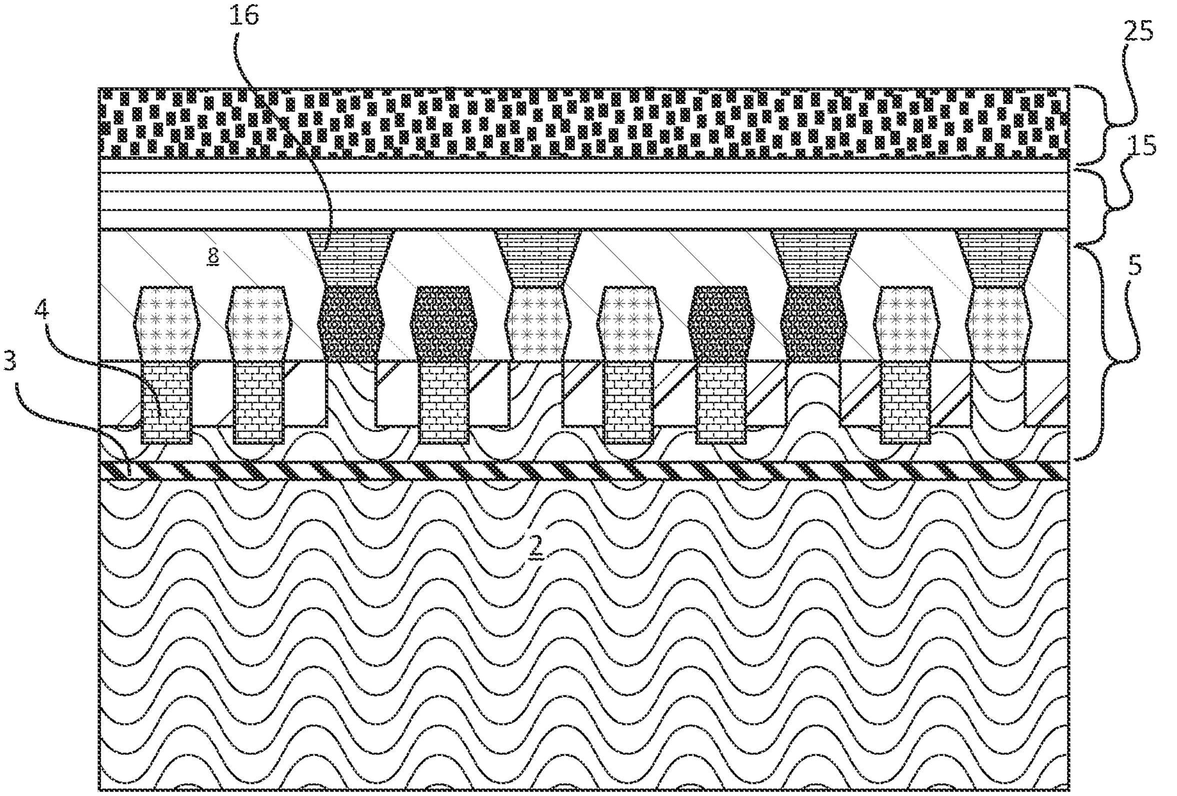
FIG. 5 is a side cross-sectional view depicting an initial structure employed for producing the semiconductor structure depicted in FIGS. 1-4, in which the cross section is taken along section line X1-X1 of FIG. 2.
Figure 6:
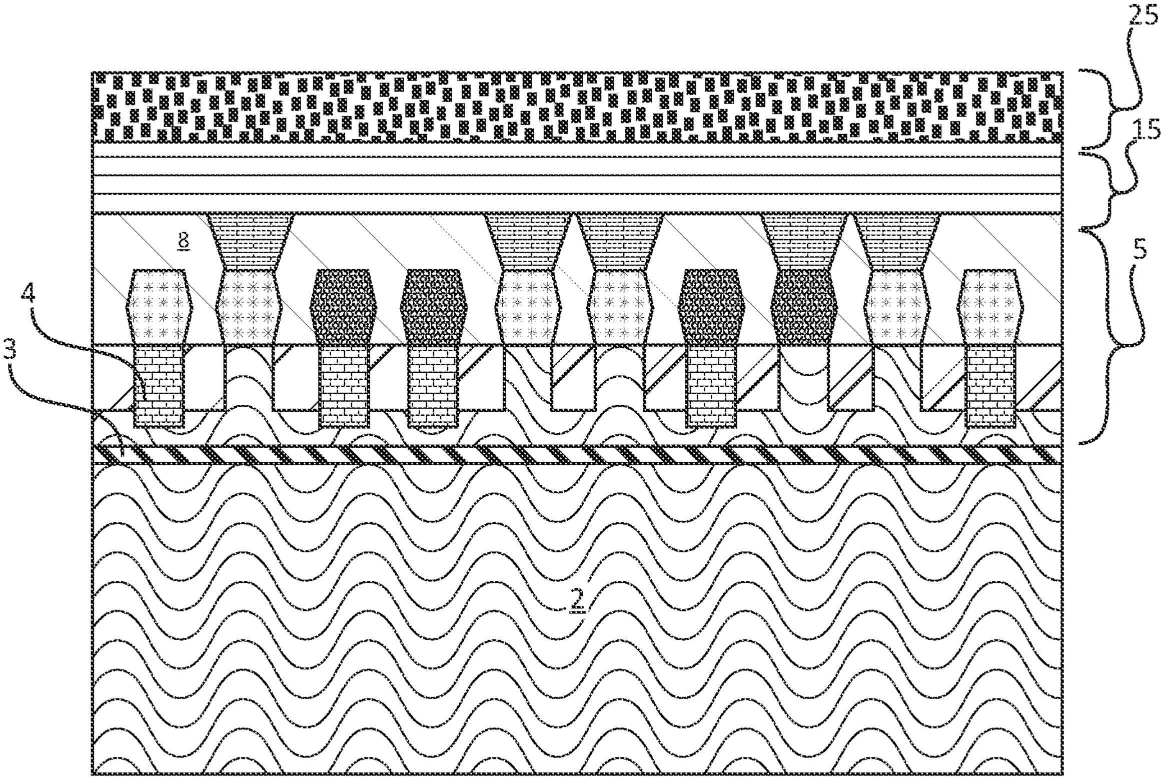
FIG. 6 is a side cross-sectional view depicting an initial structure employed for producing the semiconductor structure depicted in FIGS. 1-4, in which the cross section is taken along section line X2-X2 of FIG. 2.

FIG. 5 is a side cross-sectional view depicting an initial structure employed for producing the semiconductor structure depicted in FIGS. 1-4, in which the cross section is taken along section line X1-X1 of FIG. 2. FIG. 6 is a side cross-section view depicting an initial structure employed for producing the semiconductor structure depicted in FIGS. 1-4, in which the cross section is taken along section line X2-X2 of FIG. 2.

The initial structures illustrated in FIGS. 5 and 6 include a device layer 5 that is formed using front end of the line (FEOL) processing. In some embodiments, the processing for the FEOL processing may include additive and substrative methods, such as deposition, doping, photolithography and etching. It is noted that any number of methods may be used to form the devices in the device layer 5 in front end of the line processing. It is noted that in the example depicted in FIGS. 5 and 6 there are p-type and n-type semiconductor layers 7, 9 that are elements of the devices within the device layer. The p-type and n-type semiconductor layers 7, 9 may be composed of silicon (Si). In the initial structure, underlying the p-type and n-type semiconductor layers 7, 9 may be a sacrificial contact placeholder 4. The sacrificial contact placeholder 4 is positioned so that it may be removed to provide a via opening to the backside of the p-type and n-type semiconductor layers 7, 9. In some examples, the sacrificial contact placeholder 4 is composed of a semiconductor material having a composition that allows for selective removal by etch processing. In one example, the sacrificial contact placeholder 4 is composed of a silicon and germanium containing semiconductor material, such as silicon germanium (SiGe). The via opening formed by removing the sacrificial contact placeholder 4 can be filled with an electrically conductive material to provide backside contacts 6 that will provide for direct contact between selected p-type and n-type semiconductor layers 7, 9 and the first line network, e.g., first metal lines (M1).

Following front end of the line (FEOL) processing, the back end of the line (BEOL) layer 15 may be formed. The back end of the line (BEOL) layer may include one or more dielectric layer. The back end of the line (BEOL) layer 15 may include metallization layer, e.g., metal lines, present therein. Similar to the device layer 5 that is formed using front end of the line (FEOL) processing, the dielectric layers and metallization of the BEOL layer 15 may be formed using additive and substrative methods, such as deposition, doping, photolithography and etching. It is noted that any number of methods may be used to form the BEOL layer 15. It is further noted, that in some embodiments, during the process sequence the BEOL contact 16 is formed to an upper surface of selected p-type and n-type semiconductor layers 7, 9.

Still referring to FIGS. 5 and 6, in some embodiments, the initial structure may also include a semiconductor substrate 2 and an etch stop layer 3. The compositions of the semiconductor substrate 2 and the etch stop layer 3 may be considered in their selection, as the semiconductor substrate 2 is removed by an etch that is selective to the etch stop layer 3. In one example, the semiconductor substrate 2 is composed of silicon, and the etch stop layer 3 is composed of silicon nitride. In some embodiments, the semiconductor substrate 2 provides support for the structure during FEOL processing. The carrier wafer 25 may be bonded to the BEOL layer 15, in which the carrier wafer 25 provides support following removal of the semiconductor substrate 2 during the process sequence for forming the backside power distribution layer 10.

Figure 7:
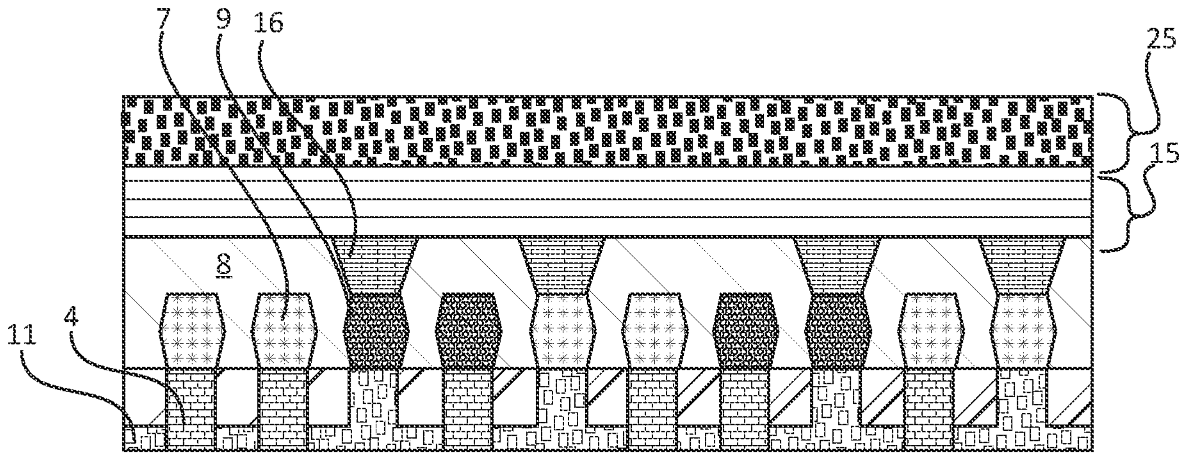
FIG. 7 is a side cross-sectional view illustrating removing the substrate and etch stop layer from the initial structure depicted in FIG. 5.
Figure 8:
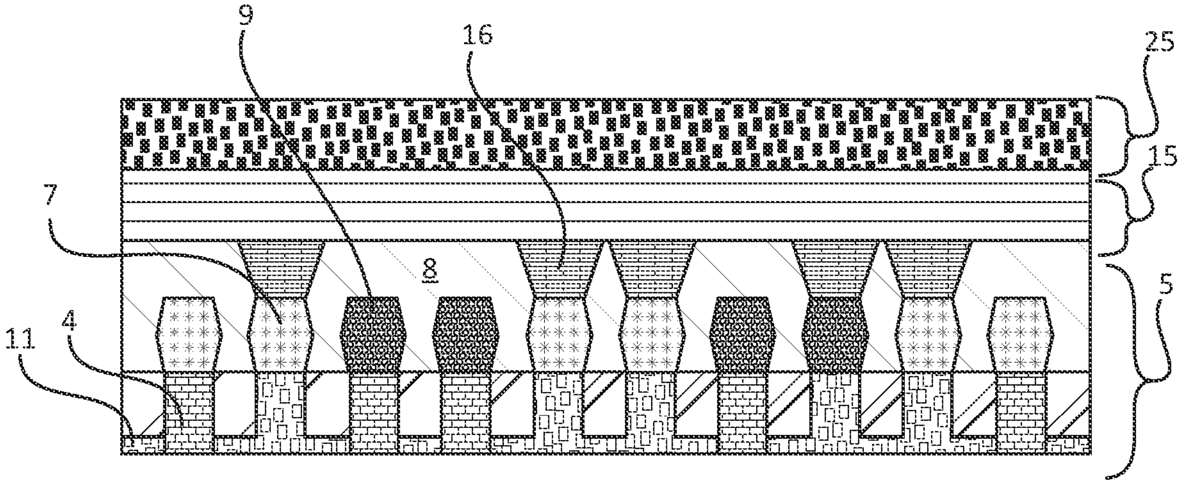
FIG. 8 is a side cross-sectional view illustrating removing the substrate and etch stop layer from the initial structure depicted in FIG. 6.

FIGS. 7 and 8 illustrate removing the substrate 2 and etch stop layer 3 from the initial structure depicted in FIGS. 5 and 6. During this step, the structure may be flipped, and the carrier wafer 25 provides support. For example, the substrate 2 may be removed by an etch process that is selective to the etch stop layer 3. The etch stop layer 3 may then be removed by an etch selective to a remaining semiconductor material in the device layer 5. In some embodiments, the aforementioned etch processes may be substituted or accompanied by planarization, e.g., chemical mechanical planarization (CMP). The remaining semiconductor material in the device layer 5 may then be removed by an etch that is selective to the p-type and n-type semiconductor layers 7, 9, the shallow trench isolation (STI) layers, and the sacrificial contact placeholder 4. It is noted that removing the remaining semiconductor material in the device layer 5 can provided openings to the backside surfaces of some of the p-type and n-type semiconductor layers 7, 9 that are not contacted by the sacrificial contact placeholder 4.

FIGS. 7 and 8 further depict forming a backside interlevel dielectric layer 11. The backside interlevel dielectric layer 11 can fill the opening provided by removing the remaining semiconductor material in the device layer 5. The backside interlevel dielectric layer 11 may be formed using a depiction process, such as chemical vapor deposition (CVD). Chemical vapor deposition (CVD) is a deposition process in which a deposited species is formed as a result of chemical reaction between gaseous reactants at greater than room temperature; wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (PECVD), Metal-Organic CVD (MOCVD) and combinations thereof may also be employed. In other embodiments, the inner spacer **60*a*** may be formed using atomic layer deposition (ALD). Following deposition, the deposited material may be planarized using chemical mechanical planarization (CMP).

The backside interlevel dielectric layer 11 may have a composition selected from the group consisting of silicon-containing materials, such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, α-C:H).

Figure 9:
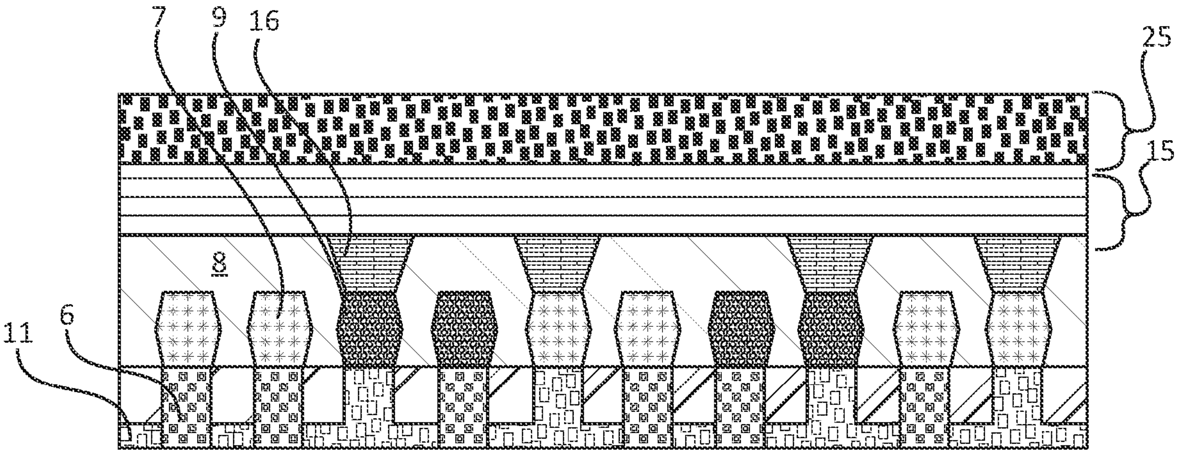
FIG. 9 is a side cross-sectional view depicting forming backside contacts to the devices within the device layer that is depicted in FIG. 7, in accordance with one embodiment of the present disclosure.
Figure 10:
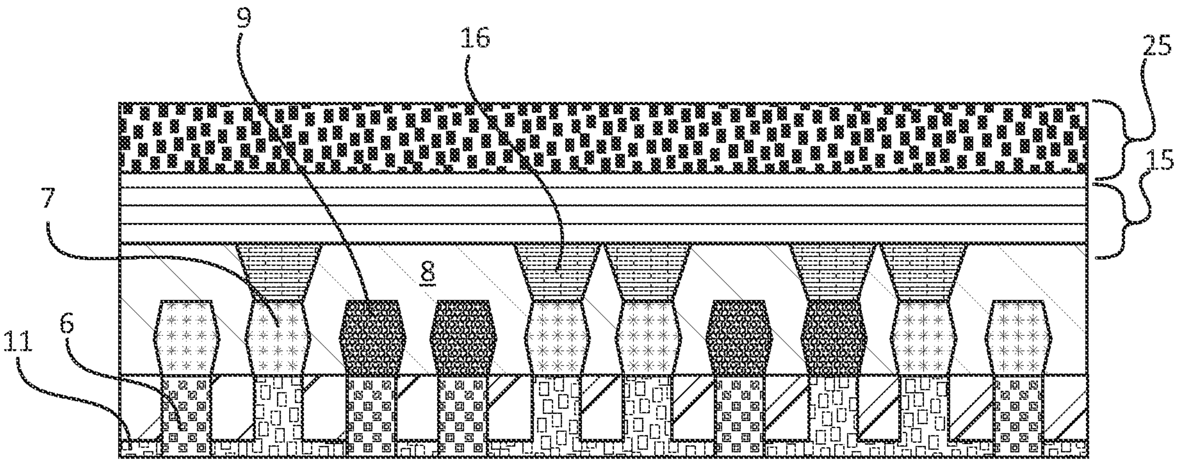
FIG. 10 is a side cross-sectional view depicting forming backside contacts to the devices within the device layer that is depicted in FIG. 8, in accordance with one embodiment of the present disclosure.

FIGS. 9 and 10 depict one embodiment of forming backside contacts 6 to the devices within the device layer 5 that is depicted in FIG. 7. Forming the backside contacts 6 may include selectively removing the sacrificial contact placeholder 4. This can be accomplished using a selective etch process. Once the sacrificial contact placeholder 4 is removed, an opening is provided leading to the backside surfaces of devices in the device layer 5. The opening may be filled with an electrically conductive material to provide a backside contact 6. The backside contact 6 may be composed of a metal, a silicide metal liner such as Ti, Ni, NiPt, an adhesion metal liner such as TiN, and low resistance metal fills, such as W, Co, Ru, etc. The fill for the backside contact 6 may be deposited using a plating process, such as electroplating or electroless plating. In other embodiments, the fill can be formed using a physical vapor deposition (PVD) process, such as sputtering. Following deposition processes, the fill material may be planarized, e.g., using a planarization process, such as chemical mechanical planarization (CMP).

Figure 11:
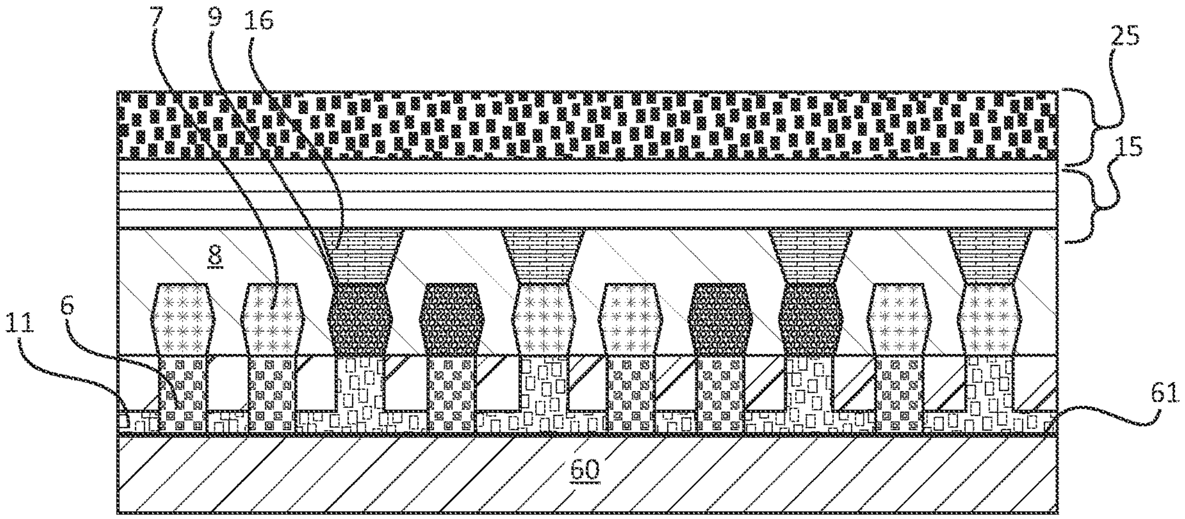
FIG. 11 is a side cross-sectional view depicting depositing a conductive material for the first line network on the structure depicted in FIG. 9, in accordance with one embodiment of the present disclosure.
Figure 12:
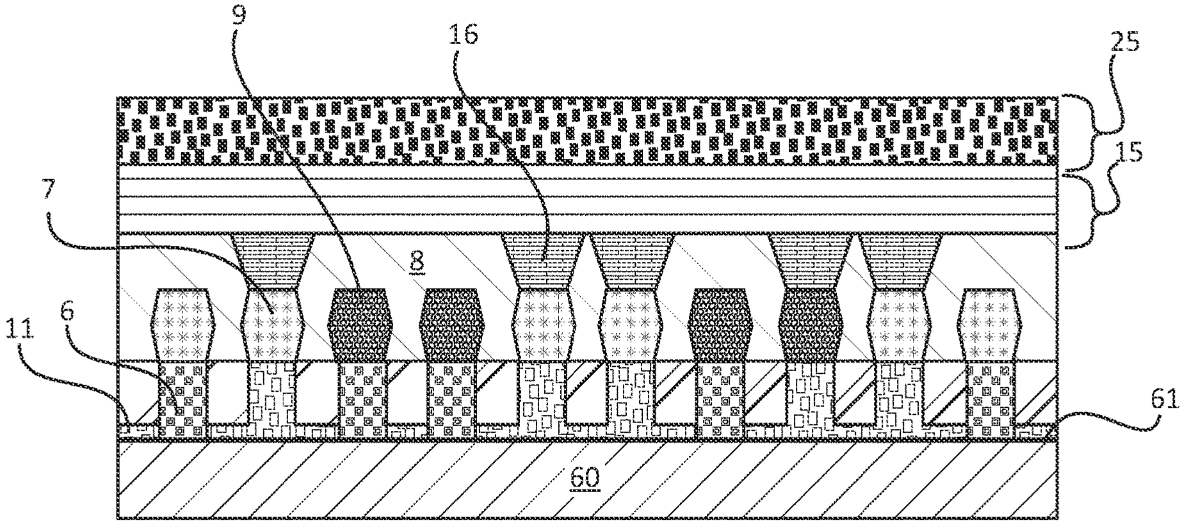
FIG. 12 is a side cross-sectional view depicting depositing a conductive material for the first line network on the structure depicted in FIG. 10, in accordance with one embodiment of the present disclosure.

FIGS. 11 and 12 depict depositing a conductive material layer 60 for the first line network 31, 32. The conductive material layer 60 may be a blanket deposited layer that can be formed using at least one of plating, chemical vapor deposition (CVD), physical vapor deposition (PVD), atomic layer deposition (ALD) or a combination thereof. The conductive material layer 60 is formed in direct contact with the backside contacts 6. In some embodiments, the conductive material layer 60 is a metal that may include, but is not limited to: ruthenium, tungsten, copper, aluminum, silver, gold and alloys thereof. In some embodiments, an adhesion layer 61 is formed prior to depositing the conductive material layer. The adhesion layer 61 may be a metal nitride, such as tantalum nitride or titanium nitride.

Figure 13:
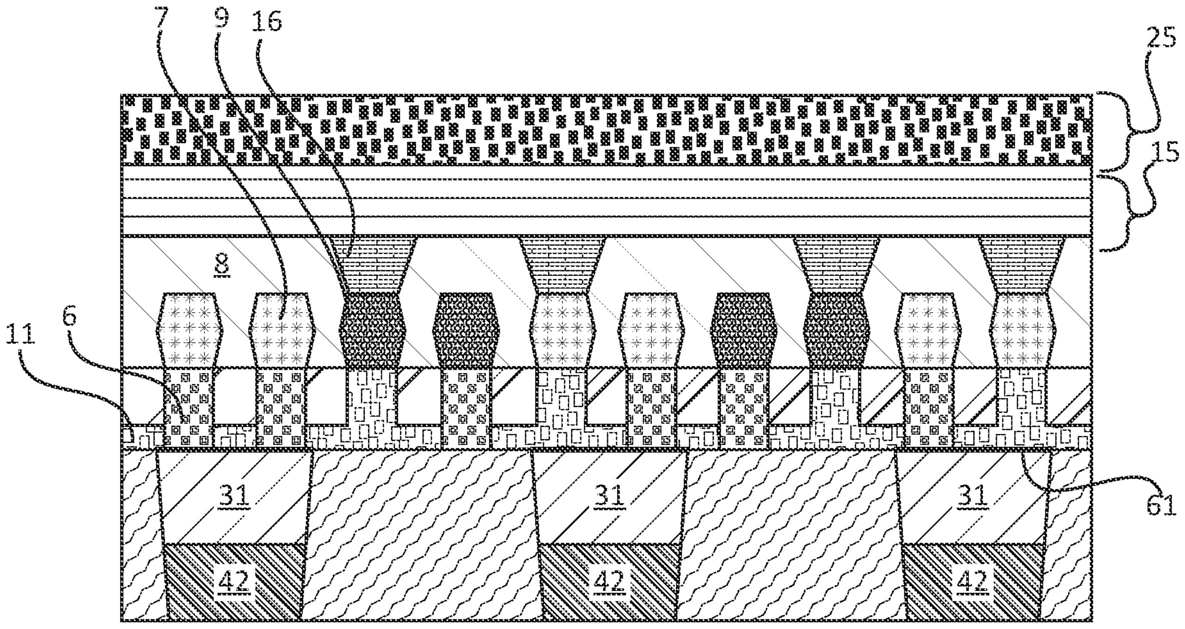
FIG. 13 is a side cross-sectional view depicting forming a hardmask on the conductive line that is depicted in FIG. 11, etching the conductive line to form an electrical contact to a first conductivity type device in the device layer, and forming an interlevel dielectric layer, in accordance with one embodiment of the present disclosure.
Figure 14:
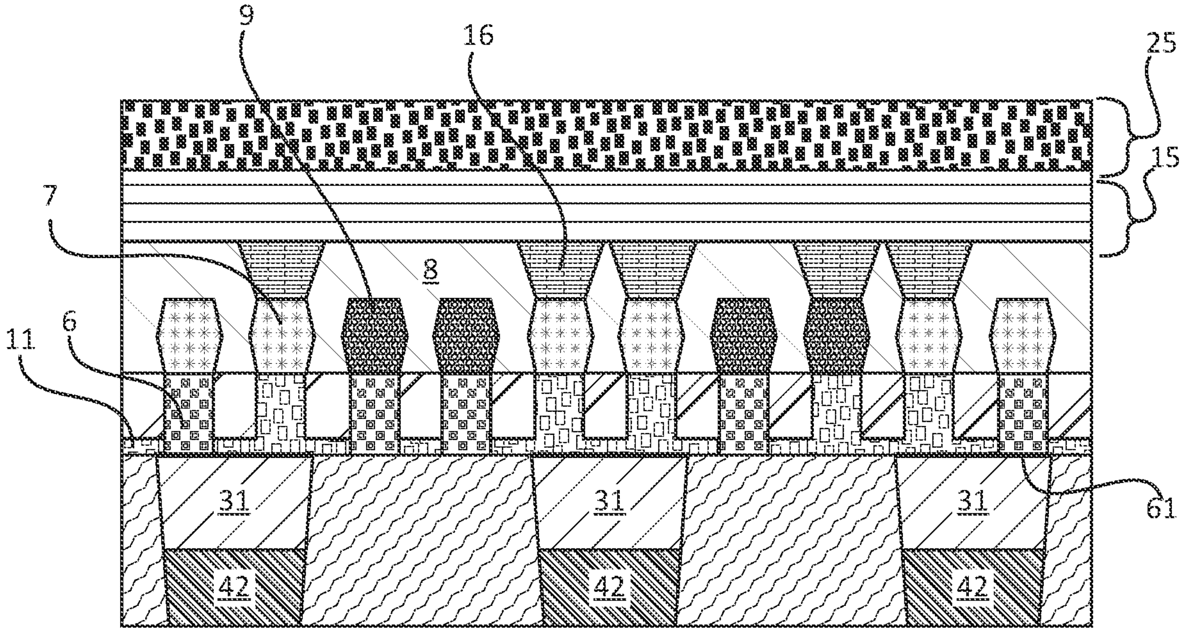
FIG. 14 is a side cross-sectional view depicting forming a hardmask on the conductive line that is depicted in FIG. 12, etching the conductive line to form an electrical contact to a first conductivity type device in the device layer, and forming an interlevel dielectric layer, in accordance with one embodiment of the present disclosure.

FIGS. 13 and 14 illustrate one embodiment of forming a hardmask 42 on the conductive material layer 60 that is depicted in FIG. 11, etching the conductive line to form a metal liner over a first conductivity type device in the device layer 5, and forming an interlevel dielectric layer 45. The hardmask 42 ultimately becomes a dielectric spacer 42 in the final device as described in FIGS. 3 and 4.

In one embodiment, the hardmask 42 comprising a hardmask material may be formed by blanket depositing a layer of hardmask material, providing a patterned photoresist atop the layer of hardmask material, and then etching the layer of hardmask material to provide a hardmask 42 protecting at least one portion of the conductive material layer 60, e.g., the first portion 30 of the metal lines from the first line network 31 that connect to backside contacts 6 which are in direct contact with a first conductivity semiconductor material of an active or passive electrical device in the device layer 5. A patterned photoresist can be produced by applying a blanket photoresist layer to the layer of hardmask material, exposing the photoresist layer to a pattern of radiation, and then developing the pattern into the photoresist layer utilizing resist developer. Etching of the exposed portion of the layer of hardmask material may include an etch chemistry for removing the exposed portion of the hardmask material and having a high selectivity to the patterned photoresist. In one embodiment, the etch process may be an anisotropic etch process, such as reactive ion etch (RIE).

Following patterning of hardmask 42, the hardmask 42 may then be employed to etch the conductive material layer 60 into a geometry that provides the first portion 30 of the metal lines from the first line network 31 that become metal lines over backside contacts 6 that are in direct contact with a first conductivity semiconductor material of an active or passive electrical device in the device layer 5. Again, the etch process may be provided by reactive ion etching (RIE).

Following the formation of the first portion (VDD) 30 of the metal lines from the first line network 31, 32, the interlevel dielectric 45 may be deposited and planarized to provide the structures depicted in FIGS. 13 and 14. The interlevel dielectric 45 that is depicted being formed in FIGS. 13 and 14 is similar to the backside interlevel dielectric layer 11 that is described above in FIGS. 7 and 8. Therefore, the above description of the composition for the backside interlevel dielectric layer 11 is suitable for describing at least one embodiment of the interlevel dielectric 45 that is depicted in FIGS. 13 and 14. In one example, the interlevel dielectric 45 is formed by a deposition process, such as chemical vapor deposition, followed by a planarization process, such as chemical mechanical planarization (CMP).

Figure 15:
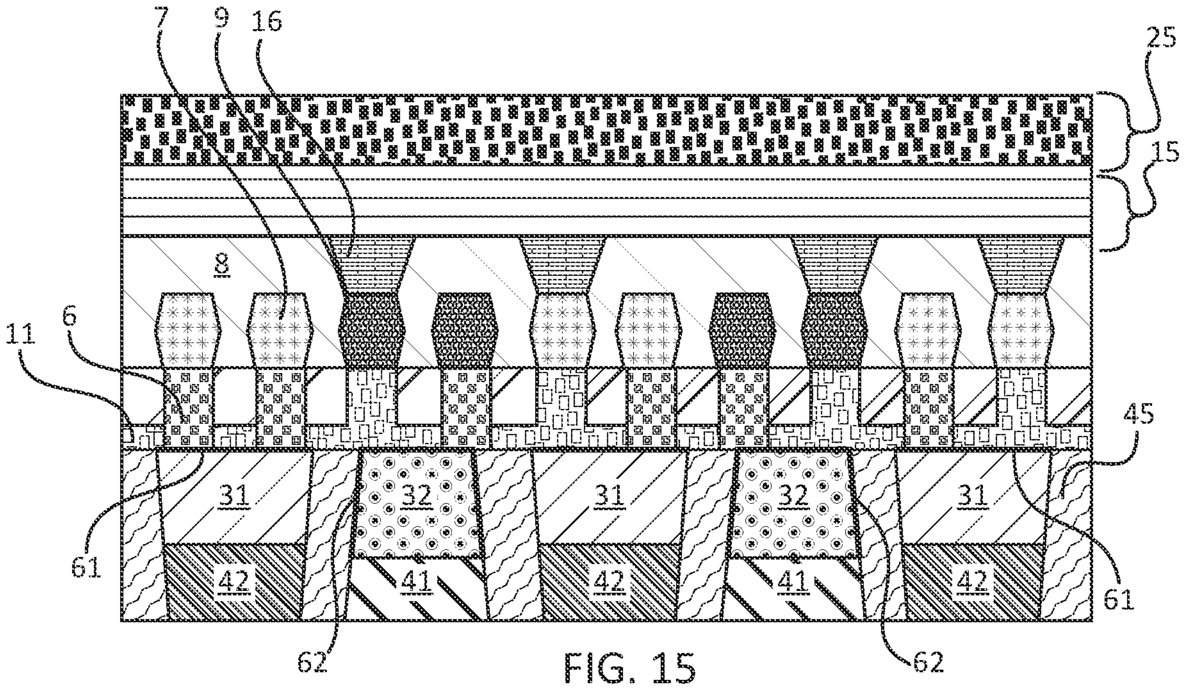
FIG. 15 is a side cross-sectional view depicting forming an opening through the interlevel dielectric to the contacts of a second conductivity type device that is in the device layer depicted in FIG. 13, filling the opening with an electrically conductive material, recessing the electrically conductive material, and forming a hardmask on the recessed electrically conductive material, in accordance with one embodiment of the present disclosure.
Figure 16:
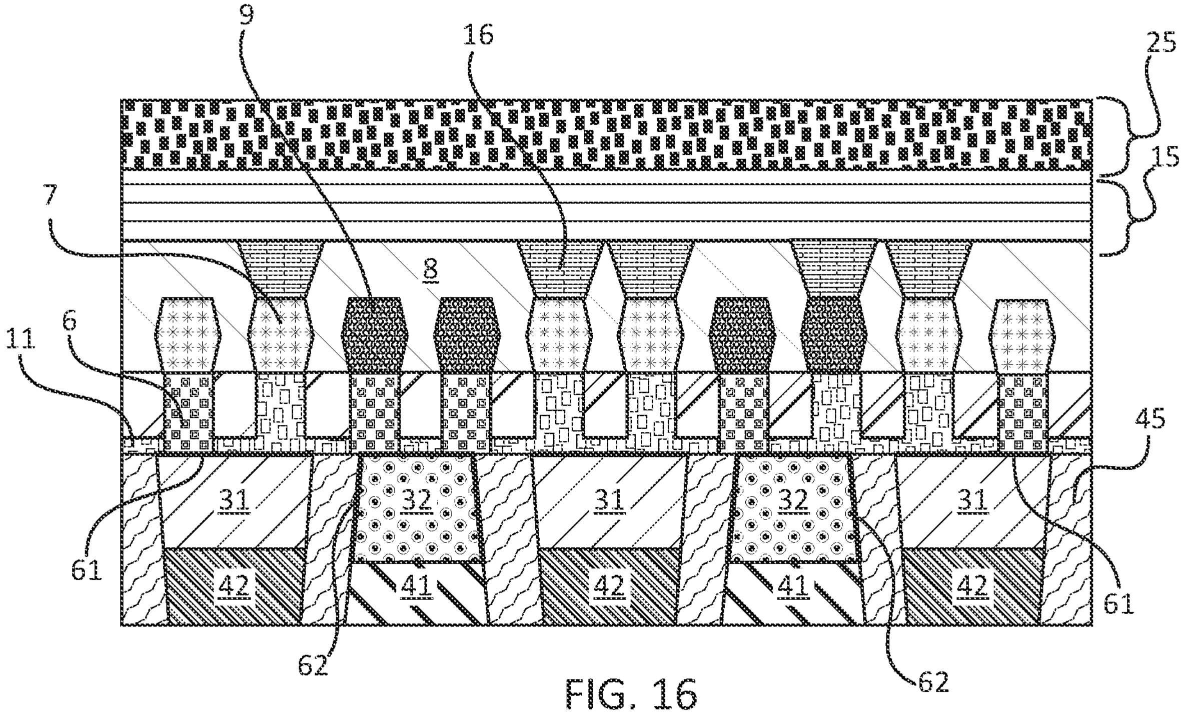
FIG. 16 is a side cross-sectional view depicting forming an opening through the interlevel dielectric to the contacts of a second conductivity type device that is in the device layer depicted in FIG. 14, filling the opening with an electrically conductive material, recessing the electrically conductive material, and forming a hardmask on the recessed electrically conductive material, in accordance with one embodiment of the present disclosure.
Figure 17:
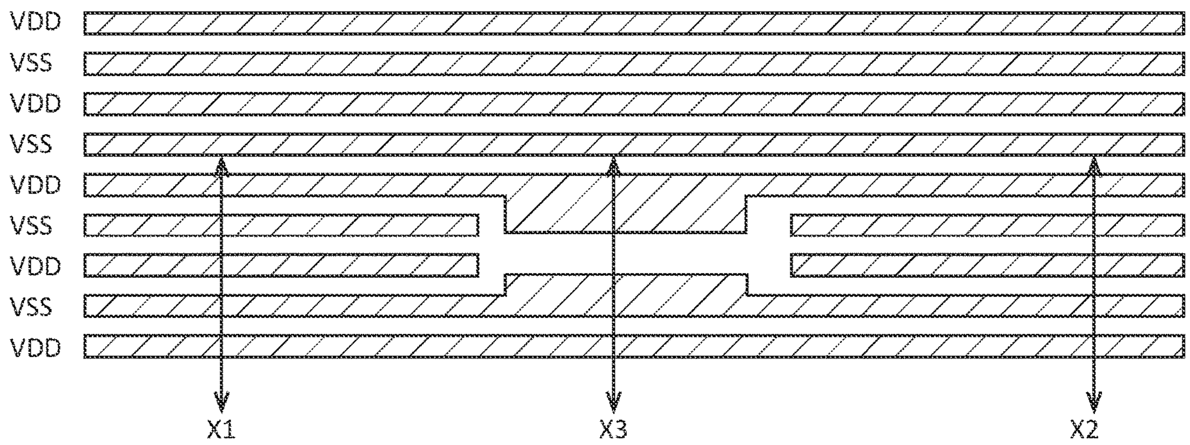
FIG. 17 is a top down view illustrating a signal input region identified by X3-X3 present between the cross sections X1-X1 and X2-X2 illustrated in FIGS. 1-4, in accordance with one embodiment of the present disclosure.

FIGS. 15 and 16 illustrate the formation of the second portion 32 of the first line network 32 that are formed over backside contact 6 that is in direct contact with the second conductivity semiconductor material of an active or passive electrical device of the device layer 5. The combination of the first and second portions of the first line network 31, 32 can be collectively referred to as the first metal line (M1) level. The first portions of the metal line network 31 are formed using a subtractive metal reactive ion etch (RIE) and therefore do not include a sidewall liner. However, the first portions include a metal liner identified by reference number 61 between the metal line 31 and the backside contact 6. The adhesion layer 61 may be composed of a metal nitride such as tantalum nitride or titanium nitride. The second portions of the metal line network 32 are formed using a damascene method and therefore include a liner on both the base and sidewall surfaces of the structure that is identified by reference number 62. The liner 62 may be composed of a metal nitride such as tantalum nitride or titanium nitride. FIGS. 15 and 16 depict forming an opening through the interlevel dielectric 45 to the contacts 6 of a second conductivity type device 9 that is in the device layer 5. The interlevel dielectric 45 is patterned and etched to form metal line trenches. Following opening formation, the openings are filled with electrically conductive material. The metal liner 62 may be deposited on the sidewalls and base of the openings prior to filling the openings with the electrically conductive material. For example, the metal liner 62 may be a metal nitride, such as tantalum nitride or titanium nitride. For example, interconnecting metal features may be formed by depositing a conductive metal into the openings using processing, such as CVD or plating. The conductive metal may include, but is not limited to: tungsten, copper, Ru, aluminum, silver, gold, and alloys thereof. The fill material provides the second portion (VSS) 32 of the first line network 31, 32 that connects to backside contact 6 that is in direct contact with the second conductivity semiconductor material of an active or passive electrical device of the device layer 5.

In some embodiments, the fill material may be recessed using an etch process relative to the backside surface of the interlevel dielectric 45. The etch process may be a selective etch process that recesses the fill material back into the opening in the interlevel dielectric 45. The space created by recessing the fill material for the second portion (VSS) 32 of the first line network 31, 32 may recessed, then be filled with a hardmask 41, as depicted in FIGS. 15 and 16. Forming the hardmask 41 may include a deposition process, such as chemical vapor deposition (CVD), that is followed by planarization, such as chemical mechanical planarization. The hardmask 41 may be composed of a dielectric material, such as an oxide, nitride or oxynitride material. For example, the hardmask 41 may be composed of silicon nitride.

It is noted that the adjacent metal lines of the first and second portion 31, 32 of the first line network also referred to as first metal line M1) are separated by a first pitch P1, as depicted in FIG. 1. This is a tighter pitch than the lines of the subsequently formed lines in the second line network 30, 35. The backside pitch P1 is selected to be small, i.e., tight, to accommodate tight cell heights in aggressive scaling of technology nodes.

Referring back to FIGS. 1-4, in a subsequent step the second line network 30, 35 may be formed. Forming the second line network 30, 35 may begin with depositing another layer of interlevel dielectric layer 46. The interlevel dielectric layer 46 that is depicted being formed in FIGS. 1-4 is similar to the interlevel dielectric layer depicted in FIGS. 13 and 14, and the backside interlevel dielectric layer 11 that is described above in FIGS. 7 and 8. Therefore, the above description of the composition for the backside interlevel dielectric layer 11 is suitable for describing at least one embodiment of the interlevel dielectric 45 that is depicted in FIGS. 13 and 14. In one example, the interlevel dielectric layer 46 is formed by a deposition process, such as chemical vapor deposition, followed by a planarization process, such as chemical mechanical planarization (CMP).

Following the formation of the interlevel dielectric layer 46 for the second line network, trenches may be formed in the interlevel dielectric layer 46 for the metal lines of the second metal line network 30, 35. The trenches for the second metal line network 30, 35 are patterned with a pitch P2 that is greater than the pitch P1 for the first metal line network 31, 32. It is desirable for the pitch P2 of the second metal line network 30, 35 to be significantly larger than the pitch P1 for the first metal line network 31, 32 so that the backside power delivery method can be finished with the minimum number of levels. In one embodiment, the second pitch P2 may be 7 times (7×) greater than the first pitch P1. In one embodiment, the first pitch P1 may be less than 180 nm. In some embodiments, the pitch P1 may be less than 100 nm In some embodiments, the semiconductor structure 100 includes self-aligned vias connecting an ultra low resistance wiring of the second line network 30, 35, e.g., second metal lines M2, to a high density wiring of the first line network 31, 32, e.g., first metal lines M1. Self-aligned vias are formed using the hardmasks on the portions of the metal lines in the first line network 31, 32 to VSS and VDD, in which the hardmask 41, 42 to the VSS and VDD power had differing composition allowing for selectively removal of one composition material hardmask 41, 42 relative to the other. It is noted that the hardmasks identified by reference numbers 41, 42 are referred to as spacers having the same reference numbers when present in the final device structure. For example, the trench that is formed in the interlevel dielectric layer 46 exposes both hardmask 41, 42. In one embodiment, the metal lines patterned in the trench exposes the hardmask 42 to the devices in the device layer 5 for electrical communication with VSS, as depicted in FIG. 4. In this scenario, the block mask 42 may be removed by an etch that is selective to the block mask 41. A photoresist mask may be employed to aid in selective removal. However, use of selective etching and the different compositions for the separate block masks 41, 42 may also provide for selective removal. Blocks masks 41, 42 may remain in trenches to provide for selective contact to the devices. In these examples, the blocks mask 41, 42 remain in the final structure, and may also be referred to as spacers. The use of photoresist mask and selective etching may be repeated with photoresist masks being formed over different regions, and with different etch chemistries providing for selective removal of block masks 41, 42 specific to regions.

Following processing to selective remove the block masks 41, 42 for providing openings for electrical connectivity of the metal lines in the second line network 30, 35, the metal for the second line network 30, 35 may be formed using a deposition process, such as chemical vapor deposition, physical vapor deposition, plating or a combination thereof. For example, the plating process may be electroplating or electroless plating. In other embodiments, the fill can be formed using a physical vapor deposition (PVD) process, such as sputtering. The metal for the metal lines to VSS and VDD of the second line network 30, 35 may be composed of a metal composition, such as copper (Cu), tantalum (Ta), titanium (Ti), aluminum (Al), platinum (Pt), as well as tungsten (W) and nitrides of the aforementioned materials. Following deposition processes, the fill material for the metal lines in the second line network 30, 35 may be planarized, e.g., using a planarization process, such as chemical mechanical planarization (CMP).

Figure 22:
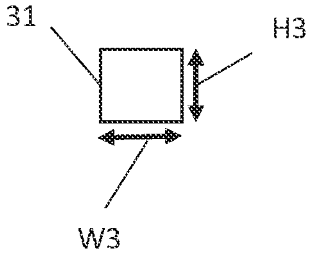
FIG. 22 is a side cross sectional view of a metal line from the first line network.
Figure 23:
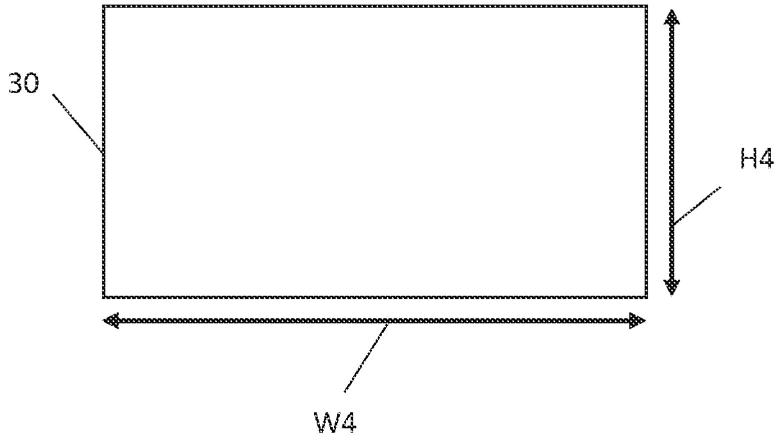
FIG. 23 is a side cross-sectional view of a metal line from the second line network.

In some embodiments, the method described with reference to FIGS. 5-16 can provide a line width and pitch ratio of 5× to 10×. In some embodiments, the method descried with reference to FIGS. 5-16 can provide a via bar length to width ratio of 5× to 10×. This is illustrated in FIG. 2 by comparison of the widths W1, W2 of the metal lines and the pitch P1, P2. This is illustrated in FIGS. 22 and 23, which illustrate the width and height for the metal lines in the first and second line networks. In some embodiments, the method described with reference to FIGS. 5-16 can provide a line resistance ratio of 20× to 50×.

Figure 18:
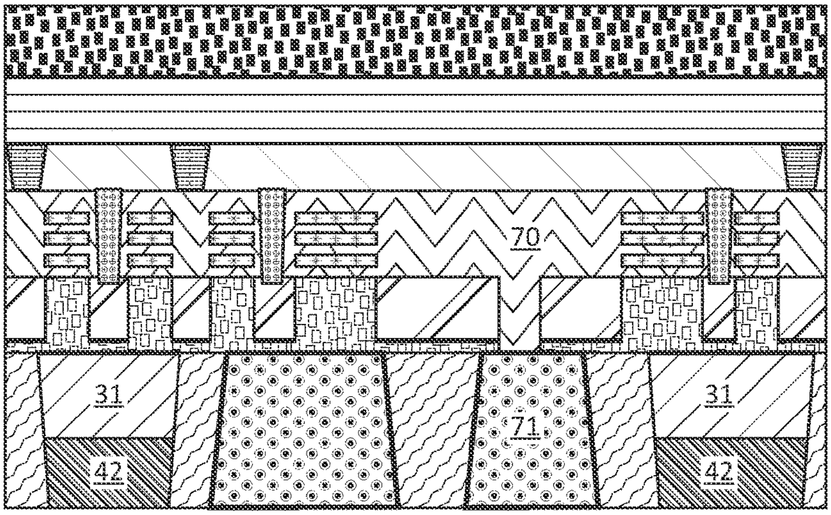
FIG. 18 is a side cross-sectional view along section line X3-X3 in FIG. 17 depicting a backside gate extension, in accordance with one embodiment of the present disclosure.
Figure 19:
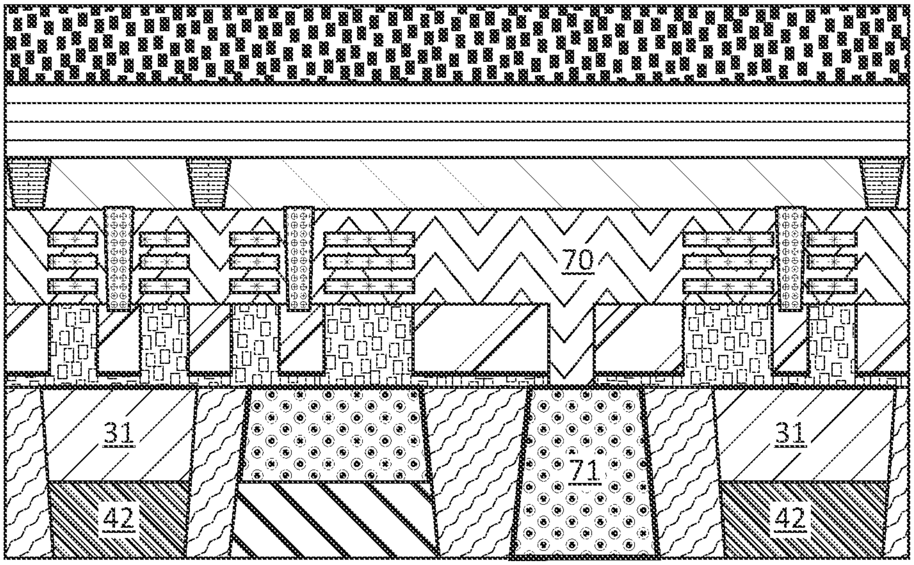
FIG. 19 is a side cross-sectional view along section line X3-X3 of forming a via contact to the backside gate extension 70 during the process sequence that forms the second portion 32 of the first line network 32, as depicted in FIGS. 15 and 16.
Figure 20:
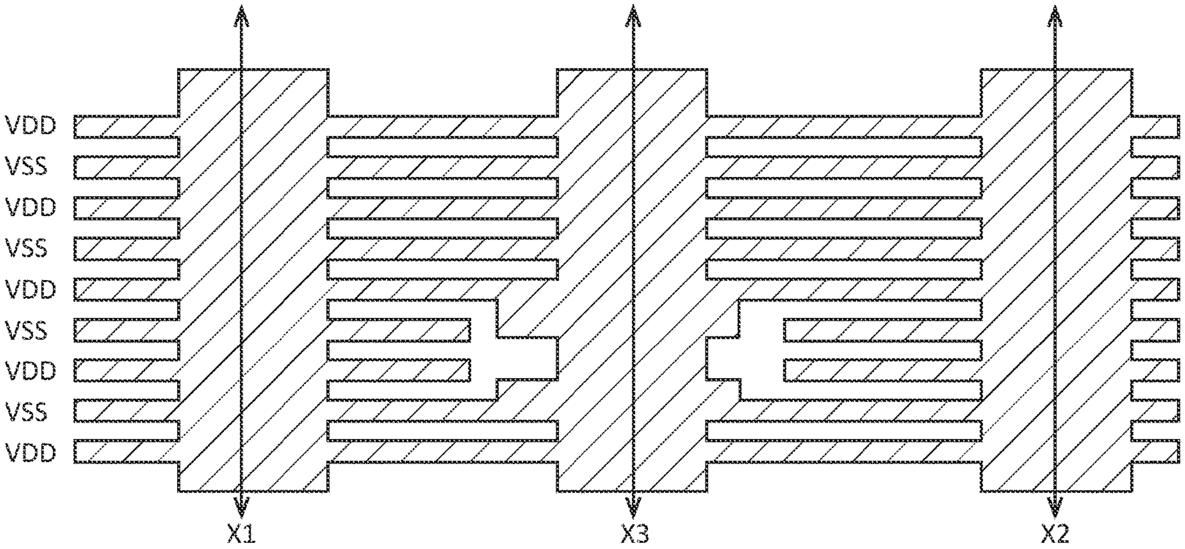
FIG. 20 is a top down view showing forming a signal line, in accordance with one embodiment of the present disclosure.
Figure 21:
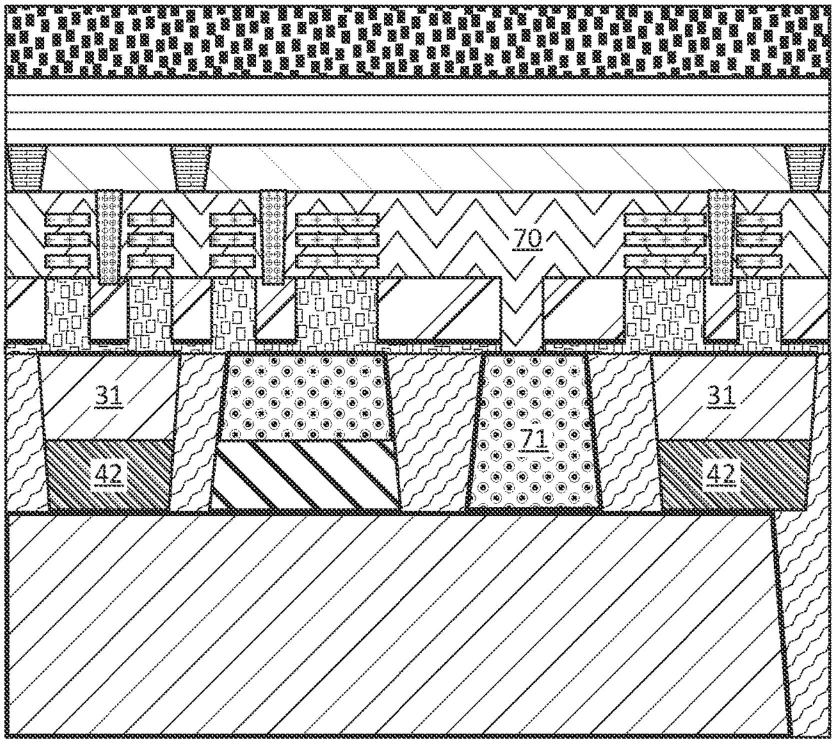
FIG. 21 is a side cross-sectional view along section line X3-X3 showing forming a signal line, in accordance with one embodiment of the present disclosure.

FIGS. 17-21 represent another embodiment of the present disclosure that adds signal inputs into the structure depicted in FIGS. 1-4 and the method that has been described with reference to FIGS. 5-16. More particularly, referring to FIG. 17, a signal input region identified by X3-X3 is added between the cross sections X1-X1 and X2-X2 illustrated in FIGS. 1 and 2. FIG. 18 is a side cross section taken along section line X3-X3 and depicts a backside gate extension that is depicted by reference number 70. The backside gate extension 70 is formed during formation of the device layer 5 using front end of the line (FEOL) processing. The backside gate extension 70 may be in electrical contact with the second line network 30, 35. For example, referring to FIG. 19, a via contact 71 may be formed to the backside gate extension 70 during the process sequence that forms the second portion 32 of the first line network 32, as depicted in FIGS. 15 and 16. FIGS. 20 and 21 illustrate how the via contact 71 is in electrical contact with a signal line 73 of the second line network 30, 35, 73. The signal line 73 may be formed into the interlevel dielectric layer 46 using photolithography, etching and deposition similar to the how the metal lines in the second line network 30, 35 have been formed, as described above.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor structure comprising:

a device layer having backside contacts;

a back end-of-line layer; and a backside power distribution layer including a first line network disposed at a first backside metallization level and comprising adjacent first metal lines directly contacting the backside contacts and having a first pitch, and a second line network disposed at a second backside metallization level farther from the device layer than the first backside metallization level and comprising adjacent second metal lines having a second pitch, wherein at least one of the second metal lines directly contacts a plurality of the first metal lines, and wherein the second pitch is greater than the first pitch.

2. The semiconductor structure of claim 1, wherein the second pitch is at least 7 times (7×) greater than the first pitch.

3. The semiconductor structure of claim 1, wherein the first pitch is less than 180 nm.

4. The semiconductor structure of claim 1, wherein the first line network and the second line network are connected by aligned vias.

5. The semiconductor structure of claim 1, wherein the device layer includes first conductivity type devices and second conductivity type devices, wherein the first line network includes a first portion of the first metal lines connected to the first conductivity type devices and a second portion of the first metal lines connected to the second conductivity type devices, and wherein the second line network includes a first portion of the second metal lines in direct contact with the first portion of the first metal lines a second portion of the second metal lines in direct contact with the second portion of the first metal lines.

6. The semiconductor structure of claim 5, wherein the first portion of the first metal lines in the first line network is isolated from the second portion of the second metal lines in the second line network by a first dielectric cap, and the second portion of the first metal lines in the first line network is isolated from the first portion of the second metal lines in the second line network by a second dielectric cap, wherein the first dielectric cap has a different composition than the second dielectric cap.

7. The semiconductor structure of claim 1, wherein the first metal lines in the first line network have a liner present only at a base of the first metal lines.

8. The semiconductor structure of claim 1, wherein the second metal lines in the second line network have a liner present on sidewalls and base surfaces of the second metal lines.

9. The semiconductor structure of claim 1, wherein at least one ratio selected from (i) a ratio of the first pitch to a width of one of the first metal lines and (ii) a ratio of the second pitch to a width of one of the second metal lines is 5× to 10×.

10. The semiconductor structure of claim 1, further comprising a via bar having a length to width ratio of 5× to 10×.

11. The semiconductor structure of claim 1, wherein a ratio of a resistance of one of the first metal lines to a resistance of one of the second metal lines is 20× to 50×.

12. The semiconductor structure of claim 1, wherein at least one of the second metal lines has a width greater than a width of one of the first metal lines directly contacted by the at least one of the second metal lines.

13. The semiconductor structure of claim 1, wherein at least two of the second metal lines each directly contacts a plurality of the first metal lines.

14. A semiconductor structure comprising:

a device layer including first conductivity type devices, and second conductivity type devices, the first and second conductivity type devices having backside contacts;

a back end-of-line layer;

a first line network of a backside power distribution level, the first line network disposed at a first backside metallization level and comprising adjacent first metal lines directly contacting the backside contacts and having a first pitch between the adjacent first metal lines, the adjacent first metal lines including a first portion of the first metal lines contacting the backside contacts of the first conductivity type devices and a second portion of the first metal lines contacting the backside contacts of the second conductivity type devices; and a second line network of the backside power distribution level, the second line network disposed at a second backside metallization level farther from the device layer than the first backside metallization level and comprising adjacent second metal lines having a second pitch between the adjacent second metal lines, the second pitch being greater than the first pitch, wherein at least one of the second metal lines directly contacts a plurality of the first metal lines, and wherein a first portion of the second metal lines connects the first portion of the first metal lines to a positive power supply and a second portion of the second metal lines connects the second portion of the first metal lines to a negative power supply.

15. The semiconductor structure of claim 14, wherein the second pitch is at least 7 times (7×) greater than the first pitch.

16. The semiconductor structure of claim 14, wherein the first line network and the second line network are connected by aligned vias.

17. The semiconductor structure of claim 14, wherein the backside contacts of the first conductivity type devices are to source and drain regions of the first conductivity type devices, and the backside contacts of the second conductivity type devices are to source and drain regions of the second conductivity type devices.

18. The semiconductor structure of claim 14, wherein the second line network further comprises a signal line in the backside power distribution level.

19. The semiconductor structure of claim 14, wherein the first portion of the first metal lines alternates with the second portion of the first metal lines.

20. The semiconductor structure of claim 14, wherein the first portion of the second metal lines is isolated from the second portion of the first metal lines, and the second portion of the second metal lines is isolated from the first portion of the first metal lines.

* * * * *